(12) United States Patent
Briere

(10) Patent No.: US 8,729,561 B1
(45) Date of Patent: May 20, 2014

(54) P TYPE III-NITRIDE MATERIALS AND FORMATION THEREOF

(75) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/455,023

(22) Filed: Apr. 24, 2012

Related U.S. Application Data

(60) Provisional application No. 61/480,515, filed on Apr. 29, 2011.

(51) Int. Cl.
*H01L 21/78* (2006.01)
*H01L 21/285* (2006.01)
*H01L 21/225* (2006.01)

(52) U.S. Cl.
CPC ...... *H01L 21/28575* (2013.01); *H01L 21/2258* (2013.01); *H01L 21/78* (2013.01)
USPC ............... 257/76; 257/103; 257/94; 438/460; 438/513; 438/628; 438/796

(58) Field of Classification Search
CPC ............ H01L 21/285; H01L 21/28575; H01L 21/2258; H01L 29/2003
USPC .......... 438/58, 143, 310, 402, 471, 476, 477, 438/758
See application file for complete search history.

(56) References Cited

U.S. PATENT DOCUMENTS

| | | | |
|---|---|---|---|
| 6,586,328 B1 * | 7/2003 | Adesida et al. | 438/628 |
| 6,611,005 B2 * | 8/2003 | Tsujimura et al. | 257/103 |
| 2001/0008285 A1 * | 7/2001 | Tsujimura et al. | 257/103 |
| 2005/0211999 A1 * | 9/2005 | Negley | 257/94 |
| 2008/0050889 A1 * | 2/2008 | Bour et al. | 438/479 |
| 2009/0134428 A1 * | 5/2009 | Ishida | 257/103 |
| 2013/0292691 A1 * | 11/2013 | Henley et al. | 257/76 |

* cited by examiner

*Primary Examiner* — Michael Lebentritt
(74) *Attorney, Agent, or Firm* — Farjami & Farjami LLP

(57) ABSTRACT

In one implementation, a method of forming a P type III-nitride material includes forming a getter material over a III-nitride material, the III-nitride material having residual complexes formed from P type dopants and carrier gas impurities. The method further includes gettering at least some of the carrier gas impurities, from at least some of the residual complexes, into the getter material to form the P type III-nitride material. In some implementations, the carrier gas impurities include hydrogen and the getter material includes at least partially titanium. An overlying material can be formed on the getter material prior to gettering at least some of the carrier gas impurities.

19 Claims, 4 Drawing Sheets

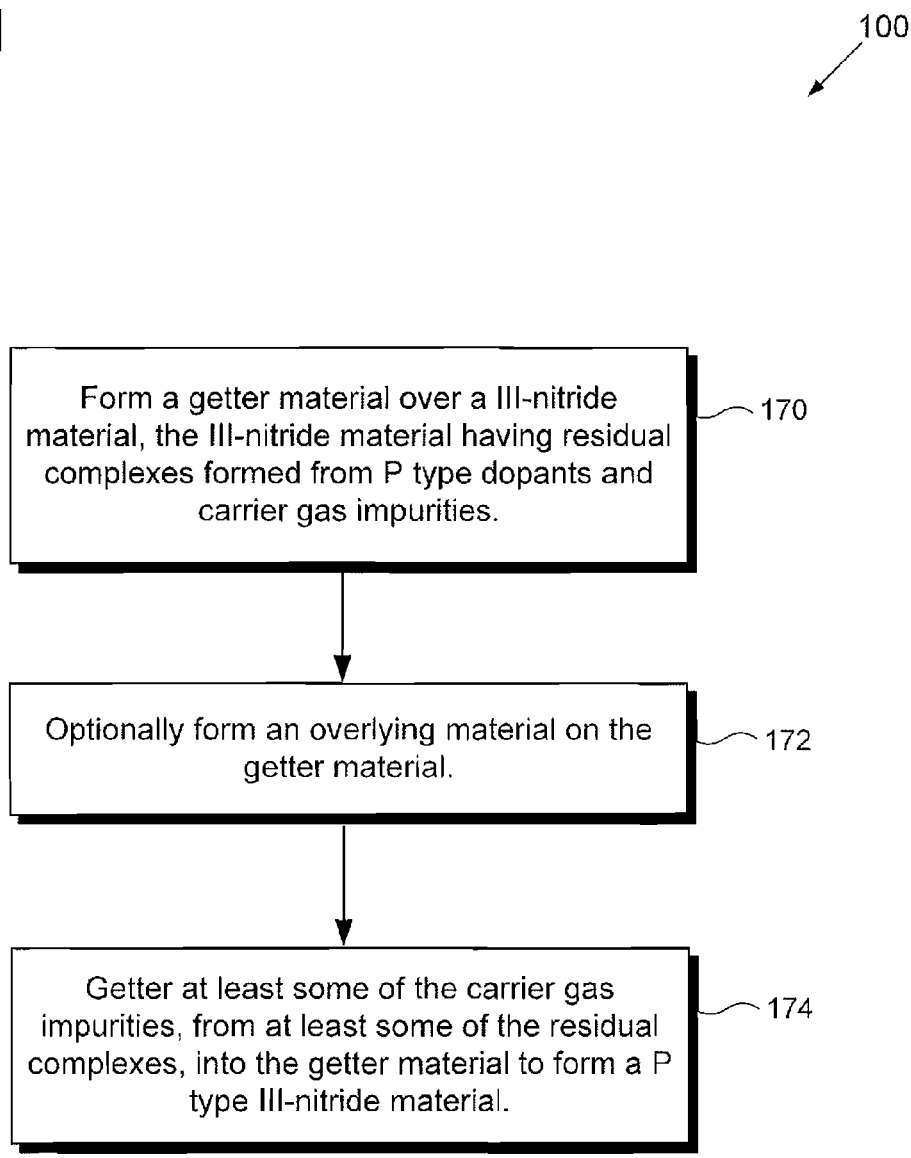

US 8,729,561 B1

P TYPE III-NITRIDE MATERIALS AND FORMATION THEREOF

The present application claims the benefit of and priority to pending U.S. provisional patent application No. 61/480,515, entitled "Method of Forming a P-Type III-Nitride Layer and Related Structure," filed on Apr. 29, 2011, which is hereby incorporated fully by reference into the present application.

BACKGROUND

I. Definitions

As used herein, the phrases "III-N," "III-nitride," "III-nitride material" and similar terms refer to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_b N_{(1-a-b)}$), aluminum indium gallium arsenide phosphide nitride ($Al_xIn_yGa_{(1-x-y)}As_aP_b N_{(1-a-b)}$), for example. III-nitride material also refers generally to any polarity including but not limited to Ga-polar, N-polar, semipolar or non-polar crystal orientations. III-nitride material may also include Wurtzitic, Zincblende or mixed polytypes, and single-crystal, monocrystalline, polycrystalline, or amorphous structures.

II. Background Art

III-nitride material can be formed, for example, by growing the III-nitride material with growth techniques that utilize a carrier gas to transport precursors to a reaction chamber. A carrier gas with a P type dopant can be supplied to the III-nitride material. The III-Nitride material typically retains impurities from the carrier gas that can act as acceptors and form residual complexes with the P type dopants provided by the carrier gas. The residual complexes may be electrically inert thereby neutralizing the P type dopant and interfering with formation of a P type III-nitride material.

The P type dopant can be activated by, for example, using a thermal anneal to break the residual complexes and free the carrier gas impurities. The III-nitride material may have been encapsulated or passivated by an overlying material so that the thermal anneal can be performed at a higher temperature without causing decomposition at the surface of the III-nitride material. When there is encapsulation or passivation, the freed carrier gas impurities typically cannot diffuse through the overlying encapsulating or passivating material and remains trapped at the surface of the III-Nitride material where it can recombine with the P type dopant thereby reforming residual complexes.

SUMMARY

The present disclosure is directed to P type III-nitride materials and formation thereof, substantially as shown in and/or described in connection with at least one of the figures, and as set forth more completely in the claims.

BRIEF DESCRIPTION OF THE DRAWINGS

FIG. 1 shows a flowchart illustrating a method of forming a P type III-nitride material, according to an implementation disclosed in the present application.

DETAILED DESCRIPTION

Figure 2A:
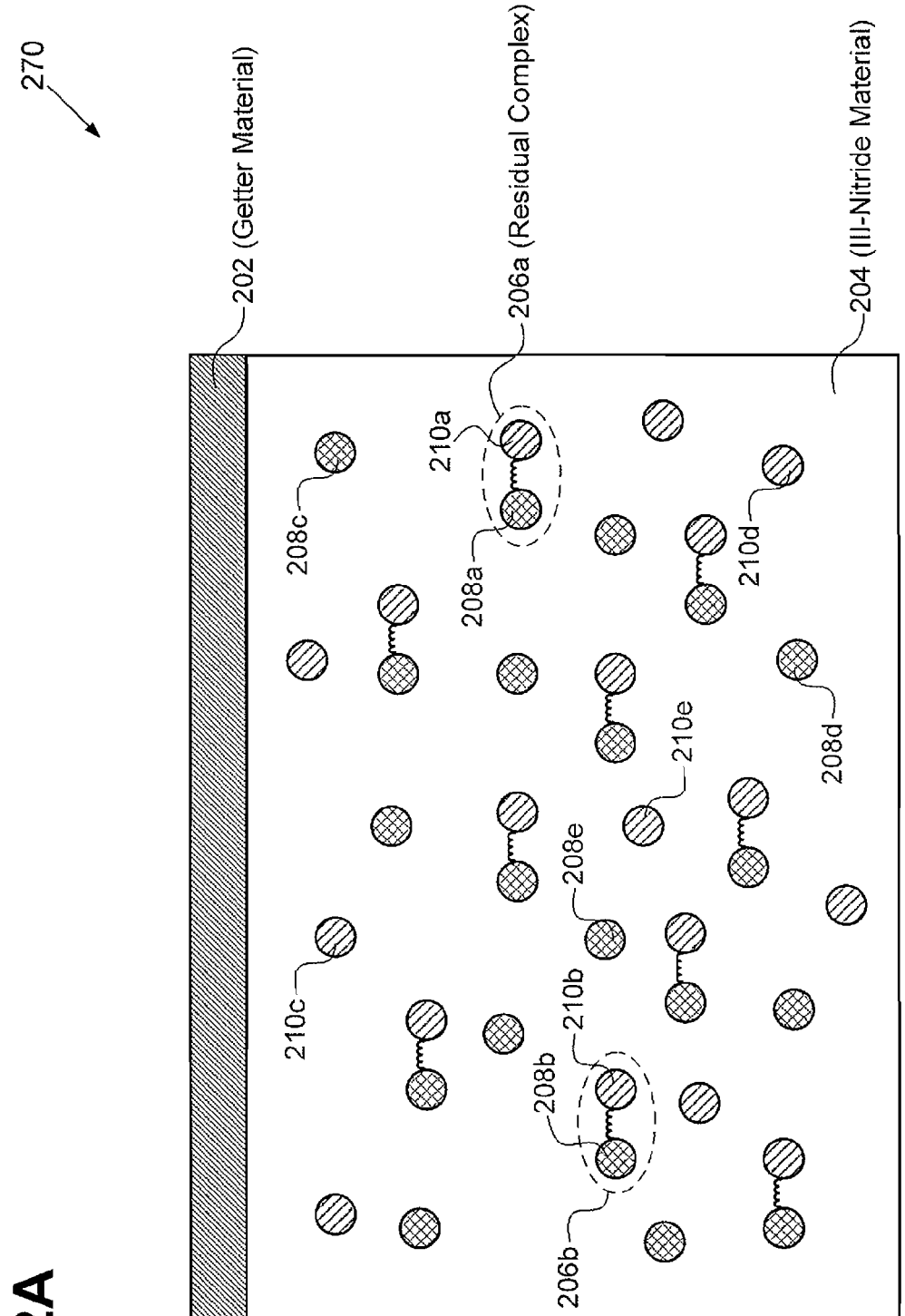
FIG. 2A illustrates a cross-sectional view, which includes a portion of a III-nitride structure according to an implementation disclosed in the present application.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows flowchart 100 illustrating a method of forming a P type III-nitride material, according to an implementation disclosed in the present application. The approach and technique indicated by flowchart 100 are sufficient to describe at least one implementation of the present disclosure, however, other implementations of the disclosure may utilize approaches and techniques different from those shown in flowchart 100. Furthermore, while flowchart 100 is described with respect to FIGS. 2A, 2B, and 2C, disclosed inventive concepts are not intended to be limited by specific features shown and described with respect to FIGS. 2A, 2B, and 2C. Furthermore, with respect to the method illustrated in FIG. 1, it is noted that certain details and features have been left out of flowchart 100 in order not to obscure discussion of features in the present application.

Referring now to flowchart 100 of FIG. 1 and FIG. 2A, flowchart 100 includes forming a getter material over a III-nitride material, the III-Nitride material having residual complexes formed from P type dopants and carrier gas impurities (170 in FIG. 1). FIG. 2A illustrates a cross-sectional view, which includes a portion of III-nitride structure 270 according to an implementation disclosed in the present application.

III-nitride structure 270 includes getter material 202 and III-nitride material 204. III-nitride structure 270 can also include other constituents not shown in FIG. 2A. For example, III-nitride material 204 can be on a substrate (not shown in FIG. 2A), such as a semiconductor substrate. Furthermore, other materials can be situated between III-nitride material 204 and the substrate, which may include other III-nitride materials.

In FIG. 2A, getter material 202 is formed over III-nitride material 204 where III-nitride material 204 has residual complexes, which include residual complexes 206a and 206b (referred to collectively as residual complexes 206). As shown in FIG. 2A, III-nitride material 204 includes P type dopants, such as P type dopants 208a, 208b, 208c, 208d, and 208e (referred to collectively as P type dopants 208) and carrier gas impurities, such as carrier gas impurities 210a, 210b, 210c, 210d, and 210e (referred to collectively as carrier gas impurities 210). P type dopants 208 can include, for example, Mg, Ca, Zn and Be, amongst others. Carrier gas impurities 210 can include, for example, atomic hydrogen (H) or molecular hydrogen (H2). FIG. 2A shows residual complex 206a includes P type dopant 208a bonded with carrier gas impurity 210a. Furthermore, residual complex 206b includes P type dopant 208b bonded with carrier gas impurity 210b.

In some implementations, III-nitride material 204, which can be a III-nitride material film, is grown using a carrier gas to transport precursors of III-nitride material 204. III-nitride material 204 can be grown using organometallic vapor phase epitaxy (OMVPE), and as a more specific example, metal organic chemical vapor deposition (MOCVD), and other techniques. For example, the carrier gas may be molecular hydrogen (H2) and can be utilized to transport metalorganic precursors to a reaction chamber to form III-nitride material 204. III-nitride material 204 can include, as examples, GaN, AlGaN, and InAlGaN.

In III-nitride material 204, carrier gas impurities 210 typically constitute unwanted impurities. For example, carrier gas impurities 210 can be atomic hydrogen (H) that can act as acceptors and form residual complexes, such as residual complexes 206a and 206b with P type dopants 208. Residual complexes 206 may be electrically inert thereby neutralizing at least some of P type dopants 208 and interfering with formation of a P type III-nitride material. For example, in the implementation shown, residual complexes 206a and 206b are each electrically inert Mg—H pairs. Thus, P type dopants 208a and 208b, for example, are unavailable to provide holes in a P type III-nitride material.

In the present implementation, getter material 202 is formed on III-nitride material 204 to provide III-nitride structure 270. In some implementations, getter material 202 is formed in-situ directly after formation of, III-nitride material 204. For example, getter material 202 can be deposited immediately after completion of III-Nitride growth without first exposing III-Nitride material 204 to atmosphere. Also, in some implementations, getter material 202 is formed ex-situ with III-nitride material 204. In certain implementations, getter material 202 completely covers III-nitride material 204. However, in other implementations, getter material 202 partially covers III-nitride material 204. For example, getter material 202 can be deposited and etched (not shown) utilizing a lithographic process.

In various implementations, getter material 202 is capable of gettering at least some of carrier gas impurities 210 from III-nitride material 204. For example, getter material 202 can include hydrogen gettering material where carrier gas impurities 210 include hydrogen. In some implementations, getter material 202 includes at least partially titanium. For example, getter material 202 can include, but is not limited to, one or more layers of titanium and/or titanium alloy, including titanium tungsten.

Figure 2B:
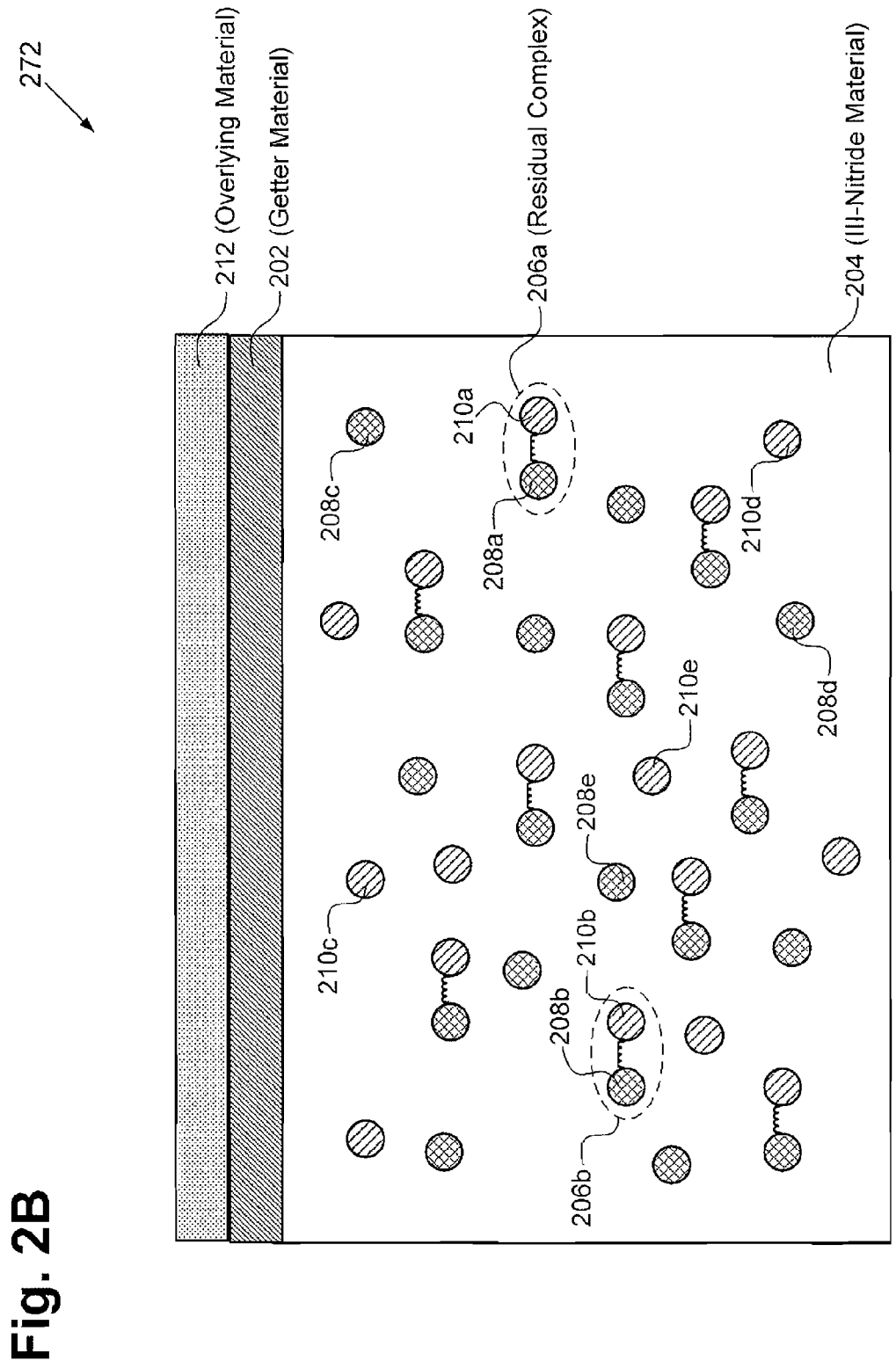
FIG. 2B illustrates a cross-sectional view, which includes a portion of a III-nitride structure according to an implementation disclosed in the present application.

Referring now to flowchart 100 of FIG. 1 and FIGS. 2A and 2B, flowchart 100 includes optionally forming an overlying material on the getter material (172 in FIG. 1). FIG. 2B illustrates a cross-sectional view, which includes a portion of III-nitride structure 272 according to an implementation disclosed in the present application.

FIG. 2B demonstrates certain implementations where overlying material 212 is formed on III-nitride structure 270 of FIG. 2A. For example, III-nitride structure 272 includes overlying material 212 formed on getter material 202. Overlying material 212 can include, as examples, passivation material, encapsulation material, and/or any other material suitable for a III-nitride structure. As further examples, overlying material 212 can include dielectric material, such as silicon nitride and/or silicon oxide. As additional examples, overlying material 212 can include organic material, polymeric material and/or metallic material. Furthermore, any of the forgoing can be provided as one or more layers. In some implementations, overlying material 212 completely covers III-nitride material 204. In other implementations, overlying material 212 partially covers III-nitride material 204. For example, overlying material 212 can be deposited and etched (not shown) utilizing a lithographic process.

Figure 2C:
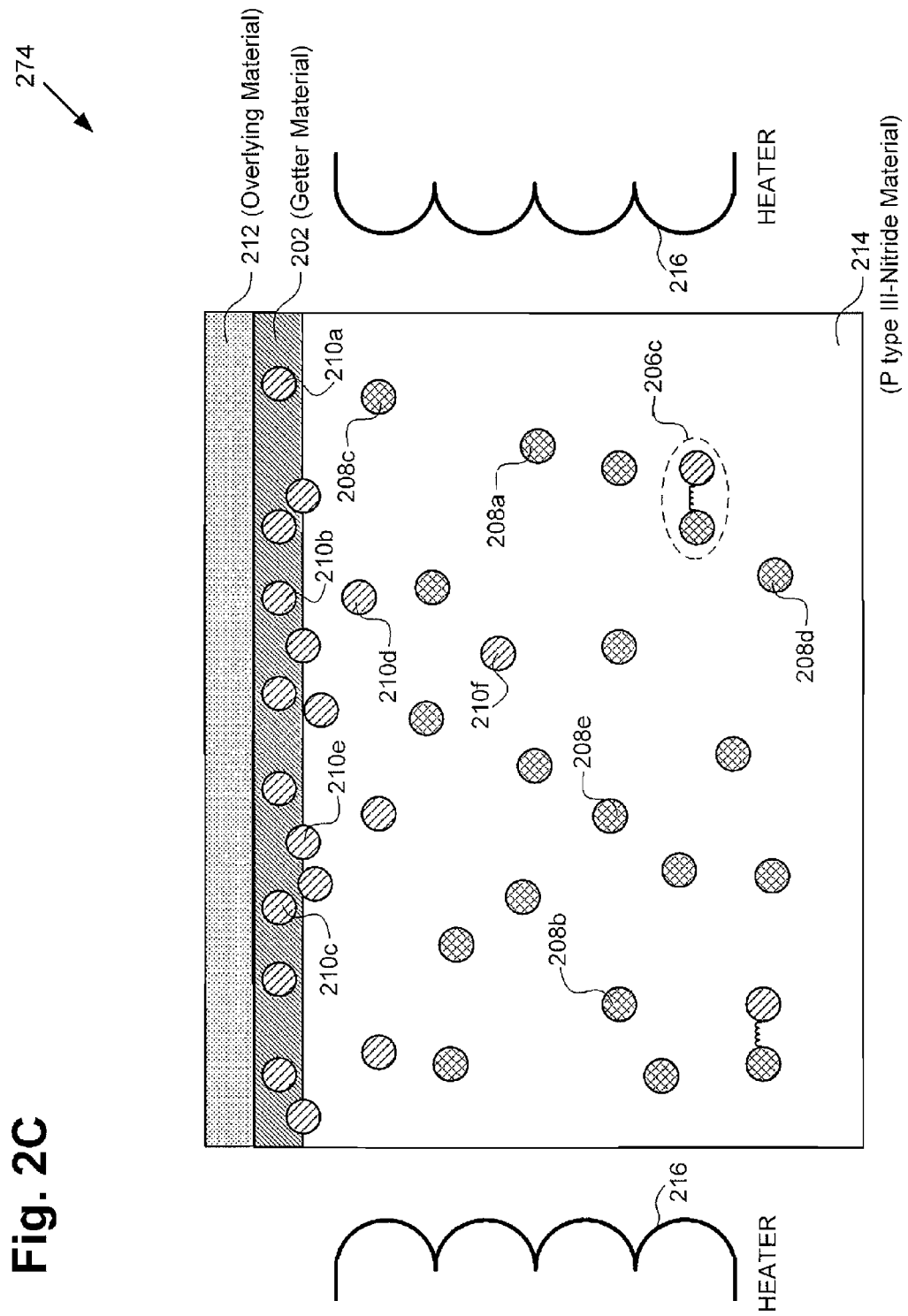
FIG. 2C illustrates a cross-sectional view, which includes a portion of a III-nitride structure having a P type III-nitride material according to an implementation disclosed in the present application.

Referring now to flowchart 100 of FIG. 1 and FIGS. 2B and 2C, flowchart 100 includes gettering at least some of the carrier gas impurities, from at least some of the residual complexes, into the getter material to form a P type III-nitride material (174 in FIG. 1). FIG. 2C illustrates a cross-sectional view, which includes a portion of III-nitride structure 274 according to an implementation disclosed in the present application.

As described above, residual complexes 206 may be electrically inert thereby neutralizing at least some of P type dopants 208 and interfering with formation of a P type III-nitride material. In accordance with implementations disclosed in the present application, at least some of carrier gas impurities 210, from at least some of residual complexes 206, are gettered into getter material 202 to form P type III-nitride material 214 of III-nitride structure 274. As such, the gettered carrier gas impurities 210 do not form residual complexes with P type dopants 208, thereby allowing P type dopants 208 to supply holes to P type III-nitride material 214.

In some implementations, at least some of P type dopants 208 are activated by freeing at least some of carrier gas impurities 210 from at least some of residual complexes 206. For example, III-nitride structure 274 in FIG. 2C shows carrier gas impurity 210a freed from residual complex 206a of III-nitride structure 272 and carrier gas impurity 210b freed from residual complex 206b of III-nitride structure 272. Thus, carrier gas impurities 210a and 210b can be gettered into getter material 202, as shown in FIGS. 2C and P type III-nitride material 214 has improved elevated activation.

Thermal annealing and/or low energy electron beam irradiation (LEEBI), amongst other means, can be utilized to break bonds between P type dopants 208 and carrier gas impurities 210 in at least some of residual complexes 206 to free at least some of carrier gas impurities 210. Where thermal annealing is utilized, III-nitride material 204 of FIG. 2B can be heated to free at least some of carrier gas impurities 210 from at least some of residual complexes 206. For example, FIG. 2C shows heater 216 for heating III-nitride material 204 of FIG. 2B. In doing so, the temperature can be elevated to a level above which bonds are broken between P type dopants 208 and carrier gas impurities 210, but low enough so that III-nitride material 204 does not decompose. Additionally, the elevated temperature can help diffuse free carrier gas impurities 210 into getter material 202.

In some implementations, gettering at least some of carrier gas impurities 210 includes driving at least some of carrier gas impurities 210 into getter material 202. For example, gettering at least some of carrier gas impurities 210 can include thermally diffusing at least some of carrier gas impurities 210 into getter material 202. The thermal diffusion may be incorporated into the thermal annealing described above. Thus, at least some of carrier gas impurities 210 can diffuse through III-Nitride material 204 and into getter material 202. As such, at least some of carrier gas impurities 210 cannot combine with at least some of P type dopants 208 to form residual complexes 206. For example, in FIG. 2C, carrier gas impurities 210a and 210b cannot recombine with P type dopants 208 to reform residual complexes 206. Thus, P type III-nitride material 214 has an increased amount of P type dopants 208 available for conduction thereby allowing for, for example, semiconductor devices with enhanced operation.

Where overlying material 212 is included without getter material 202, at least some of carrier gas impurities 210 may not be able diffuse out of III-nitride structure 272 and could subsequently form residual complexes 206. However, as at least some of carrier gas impurities 210 are gettered into getter material 202, at least some of carrier gas impurities 210 do not form residual complexes with P type dopants 208, thereby allowing for more of P type dopants 208 to supply holes to P type III-nitride material 214. Furthermore, where overlying material 212 includes encapsulation material, thermal annealing temperatures can be increased, as compared to implementations without encapsulation material, without III-nitride material 204 decomposing. As such, thermally diffusing at least some of carrier gas impurities 210 into getter material 202 can be enhanced.

Thus, III-nitride structure 274 in FIG. 2C includes P type III-nitride material 214 having P type dopants 208 to supply holes. P type III-nitride material 214 may also include, for example, residual complex 206c and/or carrier gas impurity 210f. III-nitride structure 274 further includes getter material 202 situated on P type III-nitride material 214 where getter material 202 includes at least some of carrier gas impurities 210 gettered from residual complexes of III-nitride material 204. Carrier gas impurities 210 are capable of forming residual complexes with P type dopants 208. However, carrier gas impurities 210 in getter material 202 do not form residual complexes with P type dopants 208. III-nitride structure 274 can also optionally include overlying material 212 situated on getter material 202.

Additional processing may be performed on III-nitride structure 274 to result in a III-nitride structure that includes semiconductor devices and/or additional layers (not shown). Furthermore, at least a portion of getter material 202 and/or overlying material 212 may be removed in forming a final III-nitride structure. In some implementations, the final III nitride structure includes a semiconductor device, such as a diode that relies on a P-N junction. By including, for example, the enhanced P type III-nitride material 214 in the P-N junction, performance of the semiconductor device can be enhanced. In another implementation, the semiconductor device includes a gate and P type III-nitride material 214 is situated under the gate to interrupt a 2-DEG channel to form an enhancement mode device (e.g. an enhancement mode high-electron mobility transistor). By including the enhanced P type III-nitride material 214 under the gate, performance of the semiconductor device can be enhanced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method of forming a P type III-nitride material, said method comprising:

forming a getter material over a III-nitride material, said III-nitride material having residual complexes formed from P type dopants and carrier gas impurities;

freeing at least some of said carrier gas impurities from at least some of said residual complexes;

gettering said at least some of said carrier gas impurities, from said at least some of said residual complexes, into said getter material to form said P type III-nitride material.

2. The method of claim 1, wherein said gettering said at least some of said carrier gas impurities comprises driving said at least some of said carrier gas impurities into said getter material.

3. The method of claim 1 comprising forming an overlying material on said getter material prior to said gettering said at least some of said carrier gas impurities.

4. The method of claim 1 wherein said freeing said at least some of said carrier gas impurities comprises heating said III-nitride material to free said at least some of said carrier gas impurities from said at least some of said residual complexes.

5. The method of claim 4, wherein said overlying material comprises dielectric material.

6. The method of claim 1, wherein said gettering said, at least some of said carrier gas comprises thermally diffusing said at least some of said carrier gas into said getter material.

7. The method of claim 1, wherein said carrier gas comprises hydrogen.

8. The method of claim 1, wherein said P type dopant is selected from the group consisting of Mg, Ca, Zn, and Be.

9. The method of claim 1, wherein said getter material comprises at least partially titanium.

10. A method of forming a P type III-nitride material, said method comprising:

forming a getter material over a III-nitride material, said III-nitride material having residual complexes formed from P type dopants and hydrogen;

freeing at least some of said hydrogen from at least some of said residual complexes;

gettering said at least some of said hydrogen, from said at least some of said residual complexes, into said getter material to form said P type III-nitride material.

11. The method of claim 10 comprising growing said III-nitride material using a hydrogen containing carrier gas to transport precursors of said III-nitride material.

12. The method of claim 10 comprising forming an overlying material on said getter material prior to said gettering said at least some of said hydrogen.

13. The method of claim 10, wherein said gettering said at least some of said hydrogen comprises thermally diffusing said at least some of said hydrogen into said getter material.

14. The method of claim 10, wherein said getter material comprises at least partially titanium.

15. A III-nitride structure comprising:

a P type III-nitride material having P type dopants;

a getter material situated on said P type III-nitride material, said getter material comprising carrier gas impurities freed from and gettered from residual complexes of a III-nitride material.

16. The III-nitride structure of claim 15, wherein said carrier gas impurities comprise hydrogen.

17. The III-nitride structure of claim 15, comprising an overlying material on said getter material.

18. The III-nitride structure of claim 15, wherein said carrier gas impurities are capable of forming residual complexes with said P type dopants.

19. The III-nitride structure of claim 15, wherein said getter material comprises at least partially titanium.

* * * * *